United States Patent [19]

Holdren et al.

[11] 4,165,483
[45] Aug. 21, 1979

[54] CAPACITIVE PICK-OFF CIRCUIT

[75] Inventors: Fred V. Holdren; Rand H. Hulsing, II, both of Redmond; Kurt E. Steinke, Bellevue, all of Wash.

[73] Assignee: Sundstrand Data Control, Inc., Redmond, Wash.

[21] Appl. No.: 874,000

[22] Filed: Jan. 31, 1978

[51] Int. Cl.$^2$ ............................................. G01R 27/02
[52] U.S. Cl. ................................................... 324/60 C
[58] Field of Search ............. 324/60 R, 60 C, 60 CD, 324/61 R

[56] References Cited

U.S. PATENT DOCUMENTS

| | | | |
|---|---|---|---|
| 2,721,975 | 10/1955 | Wojciechowski | 324/61 R |
| 2,820,194 | 1/1958 | Reinartz | 324/60 R X |
| 3,135,916 | 6/1964 | Tannenbaum et al. | 324/60 R |
| 4,065,715 | 12/1977 | Jaffe et al. | 324/60 CD |
| 4,086,528 | 4/1978 | Walton | 324/61 R |
| 4,093,915 | 6/1978 | Briefer | 324/60 R |

Primary Examiner—Stanley T. Krawczewicz
Attorney, Agent, or Firm—Ted E. Killingsworth; Michael B. McMurry; William R. Peoples

[57] ABSTRACT

An improved capacitive pick-off circuit is provided by utilizing a reference current generator to apply a square wave to a pick-off capacitor and the resulting voltage across the capacitor is then applied to a fixed capacitor. The resulting fixed capacitor current then provides a measure of the capacitance of the pick-off capacitor. A differential capacitive pick-off circuit is provided by applying the reference current to each pick-off capacitor and providing a fixed capacitor for each of the pick-off capacitors. The resulting fixed capacitor currents are combined and the resulting differential current is used as a measure of the difference in capacitance or the difference in the gaps between the plates of the capacitors.

5 Claims, 2 Drawing Figures

CAPACITIVE PICK-OFF CIRCUIT

BACKGROUND OF THE INVENTION

The invention relates to capacitive pick-off circuits; that is, circuits that are used to determine the capacitance or the gap between plates of a capacitor.

In prior art capacitive pick-off systems, such as described in the copending application of Holdren et al, Ser. No. 702,389, filed on July 6, 1976, assigned to the assignee of this application, capacitance is measured by applying a time varying voltage such as a triangular wave or a saw-tooth waveform to the capacitor plates. The resulting current through the capacitors is then used as a measure of the capacitance or the gap between the plates of the capacitor. However, due to the fact that the capacitance of a capacitor varies in an inverse relationship with the distance or gap between the plates, a change in this gap will result in non-linearities in the output current which can under some circumstances in the application of the capacitive pick-off circuit be significant. For example, a ten percent change in the gap will give rise to over a one percent non-linearity, a twenty percent gap change will give rise to over a four percent non-linearity and a fifty percent gap change will result in a thirty percent non-linearity. Also, since the output current of the capacitor gets very large as the gap becomes very small, significant stability problems can appear when the capacitor is used as a position sensing element in a servoed device. Capacitive pick-off circuits are used in a large number of instrumentation type applications such as transducers and accelerometers and for some highly sensitive instruments such as servoed accelerometers and transducers where non-linearities due to significant changes in the capacitor gap distances can be a significant source of error.

In addition, the prior art capacitive pick-off circuits were, as a practical matter, limited in operation to an information bandwidth less than half of the carrier frequency or the time varying voltage applied to the capacitor plates. Due to the fact that operational amplifiers were most often used in the pick-off circuits the carrier frequency would generally have to be 20 KHz or less.

SUMMARY OF THE INVENTION

It is therefore an object of the invention to provide a capacitive pick-off circuit which will tend to eliminate non-linearities due to changes in the gap or distance between pick-off capacitor plates wherein a reference current generator is provided to apply a square wave to the capacitor and the resulting voltage across the pick-off capacitor is applied to a fixed capacitor. The current through the fixed capacitor then can be utilized as a measure of the capacitance or the distance between capacitor plates.

It is an additional object of the invention to provide a differential capacitive pick-off circuit which will eliminate non-linearities due to the varying distances between the plates in the pick-off capacitors wherein a reference current generator is utilized to apply a square wave signal to each of the pick-off capacitors and the resulting triangular shaped voltages across each of the pick-off capacitors is applied through an amplifier to a corresponding fixed capacitor. Current mirror circuits are connected to each of the amplifiers and serve to provide a current to a demodulator circuit that is equivalent to the current flowing through each of the fixed capacitors.

DETAILED DESCRIPTION OF THE INVENTION

Figure 1:
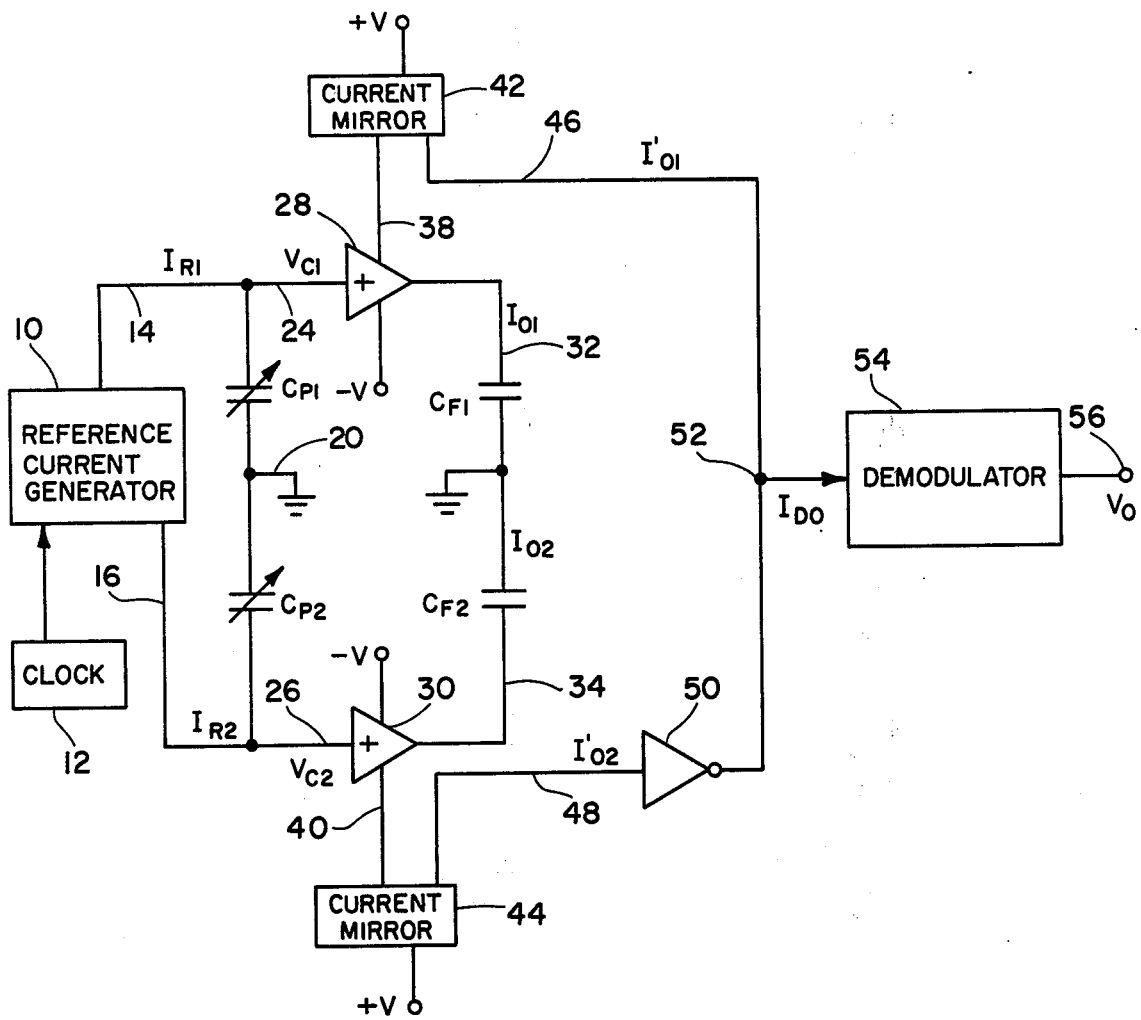
FIG. 1 is a block diagram of a differential capacitive pick-off circuit according to the invention.

Illustrated in FIG. 1 is a block diagram of the preferred embodiment of the invention which is a differential capacitive pick-off circuit wherein pick-off capacitors $C_{P1}$ and $C_{P2}$ can be used as position detecting elements in a number of different types of instrumentation including transducers, accelerometers and the like. As shown in FIG. 1, a reference current generator 10 which is typically controlled by a clock 12 applies a constant amplitude square wave current to the pick-off capacitors $C_{P1}$ and $C_{P2}$ over lines 14 and 16 respectively. A typical square wave having amplitudes of equal but opposite polarities is illustrated by waveform 18 of FIG. 2. It should be noted that a symmetrical reference current is the preferred current to be applied to the pick-off capacitors $C_{P1}$ and $C_{P2}$ but as will be explained subsequently it is not always necessary to have a symmetrical reference current for proper operation of the circuit in FIG. 1.

The reference currents $I_{R1}$ and $I_{R2}$ will flow through the pick-off capacitors $C_{P1}$ and $C_{P2}$ to a ground indicated at 20. As illustrated by waveform 22 of FIG. 2 the voltages $V_C$ across pick-off capacitors $C_{P1}$ and $C_{P2}$ will be triangularly shaped. These voltages are then applied by means of lines 24 and 26 to a pair of high input impedance voltage followers as represented by amplifiers 28 and 30. Amplifiers 28 and 30 serve to apply the pick-off capacitor voltages to a pair of fixed capacitors $C_{F1}$ and $C_{F2}$ over lines 32 and 34. The resulting currents $I_{O1}$ and $I_{O2}$ through fixed capacitors $C_{F1}$ and $C_{F2}$ are illustrated by the waveform 36 of FIG. 2. As may be appreciated from waveform 36, the resulting current through the fixed capacitors $C_{F1}$ and $C_{F2}$ will be essentially a square wave wherein the amplitude of this current will represent the capacitance or gap between the plates of the pick-off capacitors $C_{P1}$ and $C_{P2}$.

Connected by means of lines 38 and 40 to each of the voltage amplifiers 28 and 30 are a pair of current mirror circuits 42 and 44. In addition to providing a current source for the amplifiers 28 and 30, the current mirrors 42 and 44 provide a source of currents $I_{O1}'$ and $I_{O2}'$ on lines 46 and 48 respectively that are equal to or functionally related to the currents $I_{O1}$ and $I_{O2}$ flowing through the fixed capacitors $C_{F1}$ and $C_{F2}$. In the differential pick-off circuit illustrated in FIG. 1, the current flowing in line 48 is inverted by a current inverter circuit 50 so that its polarity will be opposite of the current $I_{O2}'$ flowing in line 48. The output current $I_{O1}'$ on line 46 and the inverted output current $I_{O2}'$ from inverter 50 are then combined at junction 52 and applied to a demodulator circuit 54. The function of the demodulator circuit 54 is to produce a signal $V_O$ on output terminal 56 that represents the difference in the average amplitude of the currents $I_{O1}$ and $I_{O2}$ flowing through fixed capacitors $C_{F1}$ and $C_{F2}$. It will be appreciated that when the capacitances of $C_{P1}$ and $C_{P2}$ are equal, and of course assuming that the other elements of the circuit in FIG. 1 are equal such as: $C_{F1} = C_{F2}$, $I_{R1} = I_{R2}$ and the gains of amplifiers 28 and 30, the output $V_O$ of the demodulator will be zero. When the capacitance of $C_{P1}$ and $C_{P2}$ are not equal due for example to a difference in the gaps of the capacitors the output signal $V_O$ will reflect this difference as a linear function of the difference in the gaps. The demodulator 54 can be any one of a number of well-known demodulator circuits including half-wave, full wave or synchronous demodulators.

Operation of the circuit and in particular the linear relationship between the gap or distance between pick-off capacitor plates and the output signal may be appreciated from the following discussion. Equation (1) below illustrates the basic relation between the change in pick-off capacitor voltage and the reference current $I_R$ and the capacitance of the pick-off capacitor $C_P$.

$$I_R = C_P \frac{dV_C}{dt} \qquad \text{Equation (1)}$$

Figure 2:
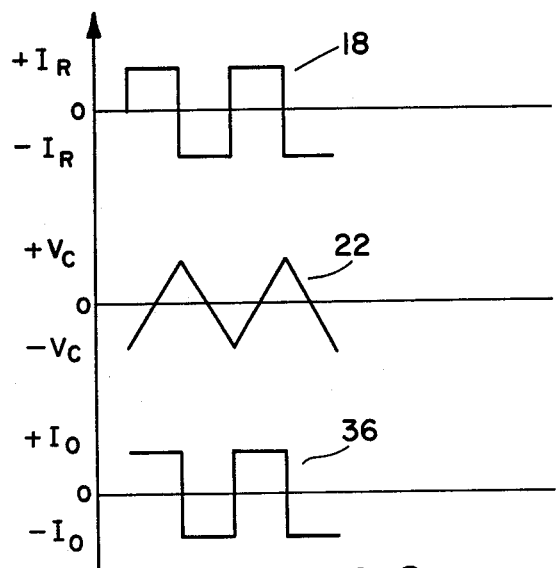
FIG. 2 is a timing diagram for the circuit of FIG. 1.

As may be seen from Equation (1) and the signal illustrated in FIG. 2 a constant amplitude square wave $I_R$ when applied to a pick-off capacitor $C_P$ will result in a triangular wave voltage across $C_P$ with the slope:

$$\frac{dV_C}{dt} = \frac{I_R}{C_P} \qquad \text{Equation (2)}$$

Since the capacitance of a plate capacitor is equal to $$C = \frac{\epsilon_0 A}{D} \qquad \text{Equation (3)}$$

where $\epsilon_0$ is the permitivity constant; A is the plate area and D is the plate gap, the following relationships hold:

$$\frac{dV_C}{dt} = \frac{I_R}{\frac{\epsilon_0 A}{D}} = \frac{I_R}{\epsilon_0 A} D \qquad \text{Equation (4)}$$

Then by applying the voltage waveform $dV_C/dt$ to the fixed capacitors $C_F$ charge/discharge currents $I_O$ having the following characteristics result:

$$I_O = C_F \frac{dV_C}{dt} = C_F \frac{I_R}{\epsilon_0 A} D \qquad \text{Equation (5)}$$

As can be seen from Equation (5), the output current $I_O$ is directly proportional to the gap between the capacitor plates of the pick-off capacitors $C_P$ as shown by waveform 36 in FIG. 2. Thus in the differential pick-off circuit of FIG. 1 the change in output currents $I_{O1}$ and $I_{O2}$ are directly proportional to any change in the gap between capacitor plates in the pick-off capacitors $C_{P1}$ or $C_{P2}$.

Operation of the differential pick-off circuit illustrated in FIG. 1 is described by the following equation:

$$I_{DO} = C_{F1} \frac{I_{R1} D_1}{\epsilon_0 A_1} - C_{F2} \frac{I_{R2} D_2}{\epsilon_0 A_2} \qquad \text{Equation (6)}$$

Therefore, if $C_{F1}$ equals $C_{F2}$ and $I_{R1}$ equals $I_{R2}$ and the areas $A_1$ and $A_2$ are equal the following relationship will hold for the circuit of FIG. 1:

$$I_{DO} = \frac{C_F I_R}{\epsilon_0 A} (D_1 - D_2) \qquad \text{Equation (7)}$$

Thus, the differential current $I_{DO}$ will be equal to the difference in gaps of the pick-off capacitors $C_{P1}$ and $C_{P2}$ with the polarity of the signal indicating which has the larger gap resulting in bipolar operation of the capacitive pick-off circuit.

As indicated before, the preferred reference currents $I_{R1}$ and $I_{R2}$ are square waves having equal amplitudes but this is not necessary for the effective operation of the capacitive pick-off circuit. A square wave reference current is preferred as a practical matter in order to keep the pick-off capacitor voltages $V_C$ within the power supply limits of the circuit including amplifier 28 and 30.

We claim:

1. A differential capacitive pick-off circuit for measuring the difference in capacitance between a first and a second capacitor comprising:
   a reference current generator circuit operatively connected to the first and the second capacitors effective to apply a time varying current to each of the capacitors resulting in a time varying voltage across each of the capacitors;
   a first fixed capacitor;
   a second fixed capacitor;
   first means for connecting the first capacitor with said first fixed capacitor resulting in said time varying voltage across the first capacitor being applied to said first fixed capacitor resulting in a current through said first fixed capacitor;
   second means for connecting the second capacitor with said second fixed capacitor resulting in said time varying voltage across the second capacitor being applied to said second fixed capacitor resulting in a current through said second fixed capacitor;
   means, operatively connected to said first and second connecting means, for combining at least a function of said first fixed capacitor current with at least a function of said second fixed capacitor current; and
   means, operatively connected to said combining means, for converting said combined current into a signal representing the difference in capacitor gaps.

2. The circuit of claim 1 wherein said time varying current is a constant amplitude square wave current.

3. The circuit of claim 1 wherein each of said first and second connecting means includes a high input impedance voltage amplifier.

4. The circuit of claim 3 wherein each of said first and second connecting means includes a current mirror circuit connected to said amplifier and to said combining means for providing said combining means with currents functionally related to said first and second fixed capacitor currents.

5. The circuit of claim 4 additionally including a current inverter operatively interposed between the current mirror of said second connecting means and said combining means.

* * * * *